(12) United States Patent
Ino et al.

(10) Patent No.: US 7,078,270 B2
(45) Date of Patent: Jul. 18, 2006

(54) SEMICONDUCTOR DEVICE AND MANUFACTURING METHOD OF SEMICONDUCTOR DEVICE

(75) Inventors: Yoshihiko Ino, Tokyo (JP); Hiroshi Kawano, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/747,300

(22) Filed: Dec. 30, 2003

(65) Prior Publication Data

US 2005/0054142 A1    Mar. 10, 2005

(30) Foreign Application Priority Data

Sep. 9, 2003  (JP) .............................. 2003/317109

(51) Int. Cl.
*H01L 21/44* (2006.01)
*H01L 21/48* (2006.01)
*H01L 21/50* (2006.01)

(52) U.S. Cl. .................. 438/123; 438/107; 438/125; 438/124; 438/615

(58) Field of Classification Search ............. 438/107, 438/123, 126, 615, 124
See application file for complete search history.

(56) References Cited

U.S. PATENT DOCUMENTS

| | | | | |
|---|---|---|---|---|
| 5,175,060 A | * | 12/1992 | Enomoto et al. | ............ 428/620 |
| 5,837,567 A | * | 11/1998 | Tanaka et al. | ............... 438/123 |
| 6,063,139 A | * | 5/2000 | Fukaya | ....................... 29/25.01 |
| 2002/0084518 A1 | * | 7/2002 | Hasebe et al. | |
| 2004/0004275 A1 | * | 1/2004 | Chen et al. | .................. 257/676 |

FOREIGN PATENT DOCUMENTS

| | | | |
|---|---|---|---|
| JP | 5-75009 | | 3/1993 |
| JP | 407335982 A | * | 12/1995 |
| JP | 11-31778 | | 2/1999 |

* cited by examiner

*Primary Examiner*—Chuong Anh Luu
(74) *Attorney, Agent, or Firm*—Wenderoth, Lind & Ponack, L.L.P.

(57) ABSTRACT

A manufacturing method of a semiconductor device includes a support member for fixing a semiconductor chip, the support member being formed between leads without applying stress to the leads. The semiconductor device includes a plurality of leads composing a lead frame, a resin island (a support member) that is formed between the leads, a semiconductor chip that is fixed on the resin island and is electrically connected to the leads by bonding wires, and sealing resin for partially sealing the semiconductor chip, the bonding wire, and the lead by resin, wherein a liquid cured resin is formed (filled) between the leads to form the resin island (the support member).

8 Claims, 7 Drawing Sheets

SEMICONDUCTOR DEVICE AND MANUFACTURING METHOD OF SEMICONDUCTOR DEVICE

BACKGROUND OF THE INVENTION

1. Field of the Invention

The present invention relates to a semiconductor device of a resin seal type using a lead frame, and a manufacturing method of the same.

This application is counterpart of Japanese patent application, Serial Number 317109/2003, filed Sep. 9, 2003, the subject matter of which is incorporated herein by reference.

2. Description of the Related Art

Conventionally, in a semiconductor device of a resin seal type, a semiconductor chip is mounted on a lead frame to be sealed by resin. The lead frame is made of metal, and has an island together with leads. The semiconductor chip is loaded and fixed on the island, and at the same time, a bonding pad and the leads, which are formed on a semiconductor chip, are electrically connected with each other.

However, the above-described semiconductor device involves a problem such that, in the event of using the large island, due to heat applied upon mounting the island on the device, a difference of a coefficient of thermal expansion between metal to be used for the island and the sealing resin is generated, so that the island is stripped off from the sealing resin and the island cracks at a lower surface of the semiconductor device.

In JP-A-5-75009 and JP-A-11-31778, it is suggested to prevent modification of an inner lead due to the thin-shaped semiconductor device and fine pitch of the semiconductor device by using an island made of a resin film, which is implanted between the leads (inner leads). According to this suggestion, since the island made of resin is used, by inhibiting the difference of a coefficient of thermal expansion between the island and the sealing resin, the island is prevented from being stripped off from the sealing resin and the sealing resin is also prevented from deficiency.

[Patent Document] JP-A-5-75009
[Patent Document] JP-A-11-31778

However, according to the above-described suggestion, since the resin film is thermo-compressed on the inner leads and the resin film is implanted between the inner leads, this involves a problem such that a stress is applied to the inner lead upon the thermo compression so that the lead is modified.

SUMMARY OF THE INVENTION

Accordingly, the present invention has been made taking the foregoing problems into consideration, and an object of the present invention is to attain the following. In other words, the object of the present invention is to provide a manufacturing method of a semiconductor device, in which a support member for fixing a semiconductor chip is formed between leads without giving stress to the leads.

In addition, the other object of the present invention is to provide a semiconductor device intending to provide a stable connection between the semiconductor chip and the leads.

Further, the still other object of the present invention is to provide a semiconductor device which is thin-shaped with a simple configuration.

The above-described problems may be solved by the following means. In other words, a manufacturing method of a semiconductor device according to the present invention may comprise the steps of: preparing a lead frame having a plurality of leads; after forming a liquid cured resin between the leads, curing the liquid cured resin and forming a support member between the leads; fixing a semiconductor chip to the support member; connecting the semiconductor chip to the leads by bonding wires; and partially sealing the semiconductor chip, the bonding wires and the lead by resin.

According to the manufacturing method of the semiconductor device of the present invention, after forming a liquid cured resin between the leads, for example, the liquid cured resin is cured by heat and ultraviolet rays to form a support member for fixing a semiconductor chip, so that it is possible to form this support member without giving stress to the leads.

In addition, according to the manufacturing method of the present invention, the modification of an inner lead due to the thin-shaped semiconductor device and fine pitch of the semiconductor device is prevented, the difference of a coefficient of thermal expansion between the support member (island) for fixing the semiconductor chip and the sealing resin is inhibited, the support member is prevented from being stripped off from the sealing resin and the sealing resin is also prevented from deficiency.

According to the manufacturing method of the semiconductor device of the present invention, the semiconductor chip may be fixed on the support member, or the semiconductor chip may be fixed so that a portion of its side surface is covered with the support member. In other words, the step of fixing the semiconductor chip to the support member may be identical with the step of, after forming the support member, fixing the semiconductor chip on the support member.

In addition, the step of forming the support member and the step of fixing the semiconductor chip to the support member may be identical with the step of arranging the semiconductor chip between the leads, and after forming the liquid cured resin between the leads, curing the liquid cured resin to form the support member between the leads, and fixing the semiconductor chip to the support member.

Specifically, a manufacturing method of the semiconductor device may comprise the steps of: preparing a lead frame having a plurality of leads; arranging a semiconductor chip between the leads; after forming a liquid cured resin between the leads, curing the liquid cured resin and forming a support member for supporting the semiconductor chip; connecting the semiconductor chip to the leads by bonding wires; and partially sealing the semiconductor chip, the bonding wires and the leads by resin.

According to the manufacturing method of the semiconductor device of the present invention, it is preferable that a connection port of the lead, to which the bonding wire is connected, may be thicker than the other portions of the lead.

According to the manufacturing method of the semiconductor device of the present invention, the step of forming the support member may be identical with the step of, after closely sticking a mold member on one surface of the lead frame, forming a liquid cured resin between the leads from the other surface thereof, and curing the liquid cured resin, or may be identical with the step of, after putting the lead frame between a pair of mold members, forming a liquid cured resin between the leads and curing the liquid cured resin.

On the other hand, a semiconductor device according to the first present invention may comprise a lead frame having a plurality of leads; a support member, which is provided between the leads and is made of resin; a semiconductor chip, which is arranged on the support member and is connected to the leads by bonding wires; and sealing resin for partially sealing the semiconductor chip, the bonding wires, and the leads; wherein a connection portion, to which the bonding wire is connected, is thicker than the other portions of the lead.

According to the semiconductor device of a first present invention, since a connection portion of the lead to which a bonding wire is connected is thicker than the other portions of the lead, even if the support member formed between the leads is thick, this connection portion is always exposed and it is possible to obtain a stable connection.

Particularly, in the event that the support member is formed by using the liquid cured resin as described above, even if the liquid cured resin that is rather bulky is formed between the leads, the liquid cures resin hardly cover this connection portion, and this results in that the connection portion is always exposed, the liquid cured resin is cured, and a stable connection is provided.

In addition, a semiconductor device according to a second present invention may comprise a lead frame having a plurality of leads; a support member, which is provided between the leads and is made of resin; a semiconductor chip, which is connected to the leads by bonding wires and of which side surface is partially covered with the support member; and sealing resin for partially sealing the semiconductor chip, the bonding wires, and the leads.

According to the semiconductor device according to the second present invention, since a portion of the side surface of the semiconductor chip is covered with the support member to fix the semiconductor chip from the side surface, it is possible to make the support member thinner.

According to the manufacturing method of the semiconductor device of the present invention, there is an advantage to form a support member for fixing the semiconductor chip between the leads without applying stress on the leads.

In addition, according to the semiconductor device of the first present invention, there is an advantage to provide the stable connection between the semiconductor chip and the leads.

In addition, according to the semiconductor device of the second present invention, there is an advantage to make the semiconductor device thinner with a simple configuration.

DESCRIPTION OF THE PREFERRED EMBODIMENTS

The embodiments according to the present invention will be described in detail below with reference to the accompanying drawings. With respect to substantially identical functional parts, the identical reference numerals are applied in all of the drawings and the explanations thereof may be omitted according to the circumstance.

First Embodiment

Figure 1:
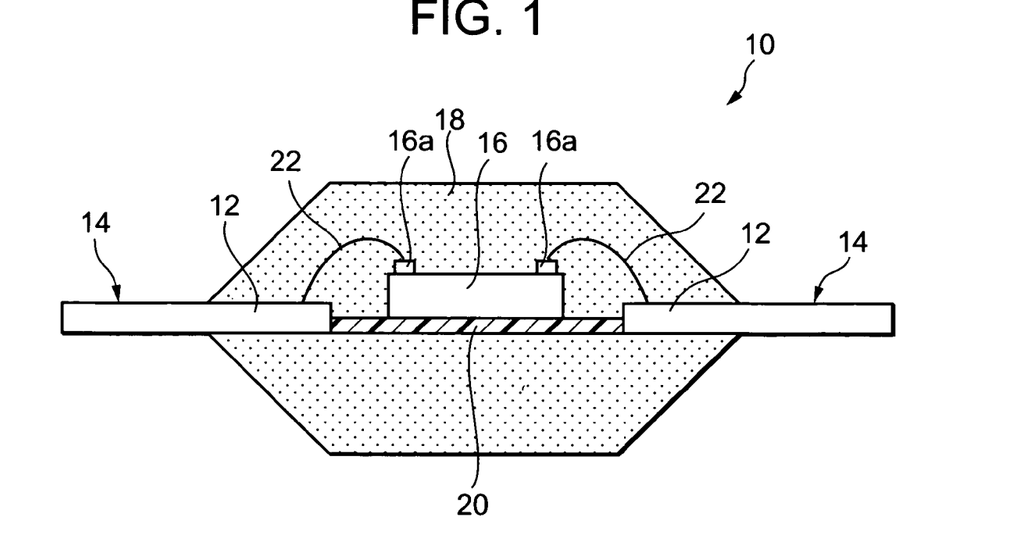
FIG. 1 is a schematic sectional view showing a semiconductor device according to a first embodiment of the present invention.
Figure 2:
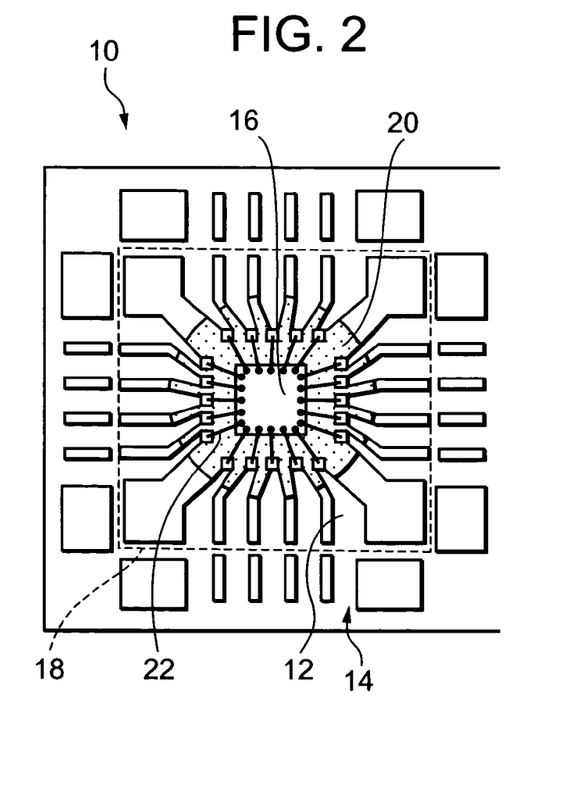
FIG. 2 is a plan view showing the semiconductor device according to the first embodiment of the present invention.

FIG. 1 is a schematic sectional view showing a semiconductor device according to a first embodiment of the present invention, FIG. 2 is a plan view showing the semiconductor device according to the first embodiment of the present invention, and FIG. 3 is a step view showing a manufacturing method of the semiconductor device according to the first embodiment of the present invention.

A semiconductor device 10 may include a plurality of leads 12 composing a lead frame 14 and a semiconductor chip 16, which are sealed by sealing resin 18.

The plural leads 12 are arranged so as to surround the semiconductor chip 16. In addition, in the region surrounded by the front ends of the leads 12 (the region where the semiconductor chip 16 is arranged) and between the front ends of adjacent leads 12, an insulative island made of resin (an insulative support member) is formed with resin implanted therein, and at the side surface of the front ends of the leads 12, the resin island 20 supports and fixes the leads 12.

The semiconductor chip 16 is loaded and fixed on the resin island 20. In addition, the semiconductor chip 16 has a bonding pad 16a on its surface, the bonding pad 16a and the lead 12 are wire-bonded by a bonding wire 22 made of metal or the like, and they are electrically connected.

Hereinafter, the manufacturing method of the semiconductor device 10 according to the present embodiment will be described below.

Figure 3A:
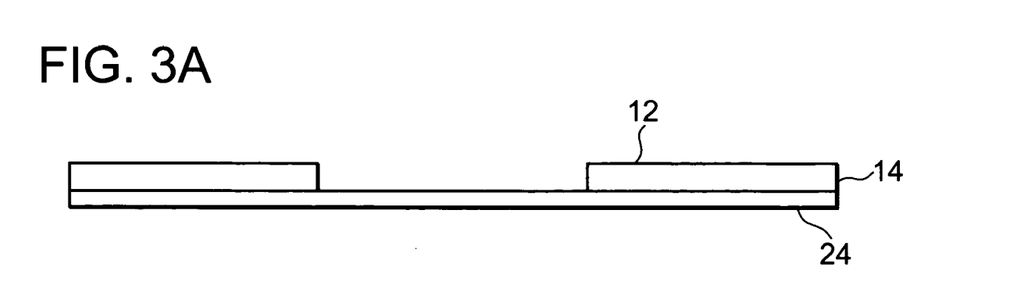
FIG. 3 is a step view showing a manufacturing method of the semiconductor device according to the first embodiment of the present invention.

At first, a mold member 24 shaped in a tape or a metal sheet or the like is pasted and closely sticks to the lower surface of the lead frame 14 (FIG. 3A).

Figure 3B:
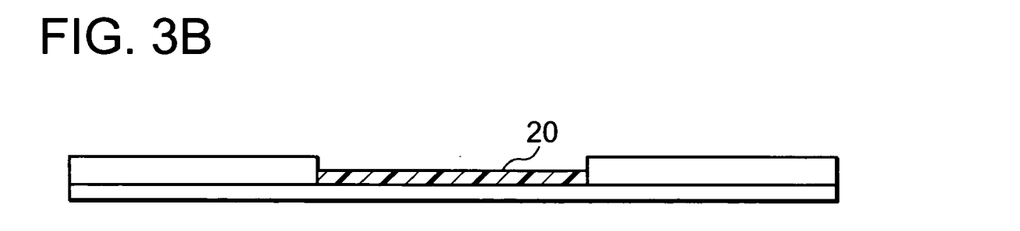

Then, after dripping (applying) a liquid cured resin from the upper surface of the lead frame 14 and filling (forming) the liquid cured resin in the region surrounded by the front ends of the leads 12 and between the front ends of the adjacent leads 12, for example, the liquid cured resin is cured by heat and ultraviolet rays to form the resin island 20. At the same time, this resin may fill a gap between the front ends of the adjacent leads 12 (FIG. 3B).

In this case, if the liquid cured resin is in a liquid state, various cured resin such as heat cured resin and ultraviolet cured resin or the like may be available, however, in consideration of the simple installation upon curing processing, the heat cured resin is preferable.

Figure 3C:
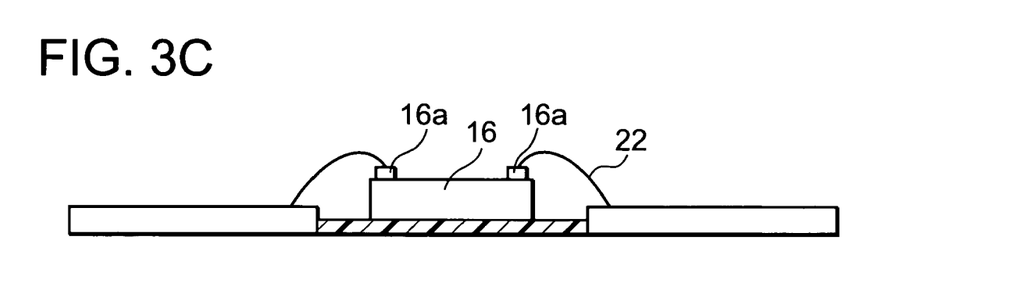

In the next step, the mold member 24 that is pasted to the lower surface of the lead frame 14 is stripped off, the semiconductor chip 16 is secured on the resin island 20, and the bonding pads 16a of the semiconductor chip 16 are electrically connected to the leads 12 by the bonding wires 22 (FIG. 3C).

Figure 3D:
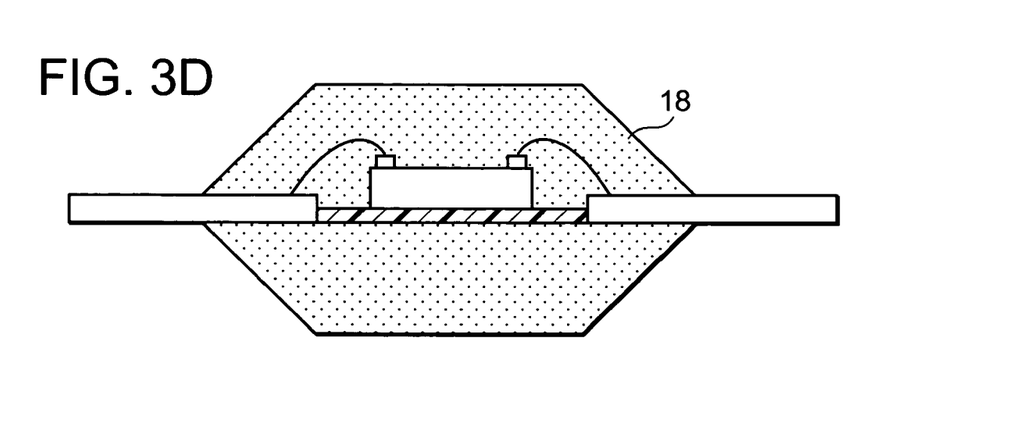

Lastly, the semiconductor chip 16, the bonding wires 22, and the leads 12 are partially sealed by the sealing resin 18 so as to obtain the semiconductor device 10 (FIG. 3D).

According to the present embodiment, because the liquid cured resin is formed (filled) between the leads 12 and cured in this way, without applying stress to the leads 12, it is possible to form the resin island 20 implanted between the leads 12.

In addition, according to the present embodiment, upon forming (filling) the liquid cured resin between the leads 12, the mold member closely sticks to one surface (the lower surface) of the lead frame 14 and the liquid cured resin drips (applies) from the other surface (the upper surface), so that it is possible to simply form (fill) the liquid cured resin between the leads 12.

Figure 4:
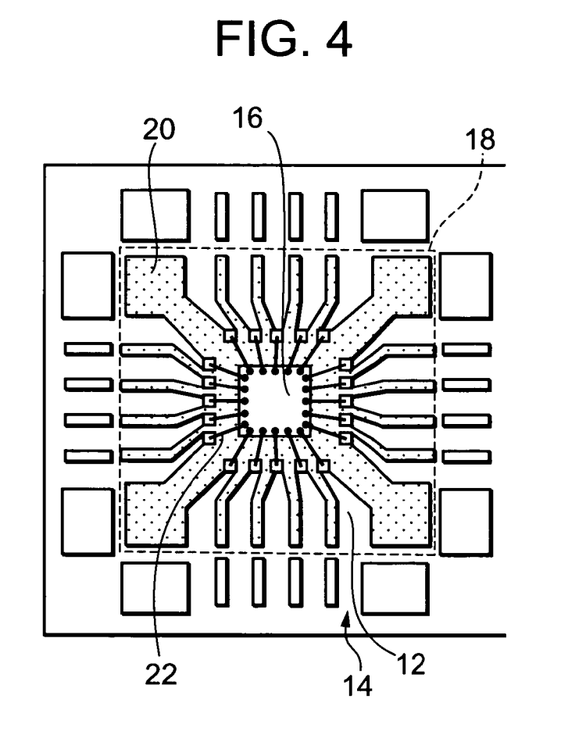
FIG. 4 is a plan view showing the other semiconductor device according to the first embodiment of the present invention.

According to the present embodiment, the front ends of the leads 12 are supported and fixed by the resin composing the resin island 20, so that this embodiment has an advantage such that the amount of the formed liquid cured resin (the amount of the filled liquid cured resin) may be allowed to be less. However, the present embodiment is not limited to this, and from the aspect of protecting the leads 12 and preventing the modification of the leads 12 after being mounted on the semiconductor chip, for example, as shown in FIG. 4, the liquid cured resin may be filled and cured between the entirety of the leads 12, such that the entirety of the leads 12 may be supported and fixed by the resin composing the resin island 20.

Second Embodiment

Figure 5:
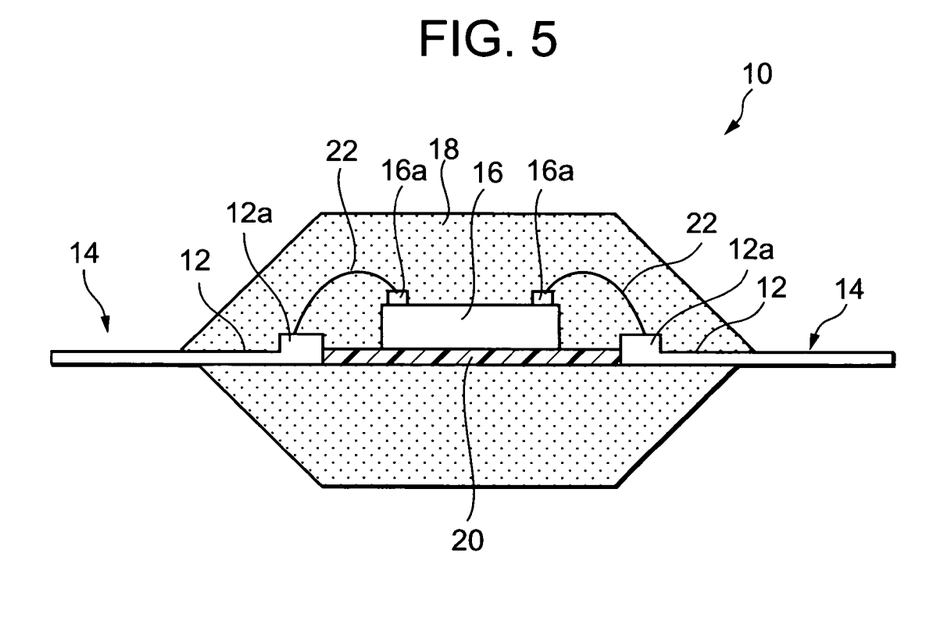
FIG. 5 is a schematic sectional view showing a semiconductor device according to a second embodiment of the present invention.

FIG. 5 is a schematic sectional view showing a semiconductor device according to a second embodiment of the present invention, and FIG. 6 is a step view showing a manufacturing method of the semiconductor device according to the second embodiment of the present invention.

According to the present embodiment, the front end 12a of the lead 12 (the connection portion: the bonded surface) projects more in a thickness direction as compared to the other portions of the lead 12, namely, the connection portion 12a of the lead 12 is thicker than the other portions thereof. Further, this front end 12a is electrically connected to the bonding pad 16a of the semiconductor chip 16 by the bonding wire 22. The explanation except for this point will be herein omitted because the present embodiment is identical to the above-described first embodiment other than this point.

Hereinafter, a manufacturing method of the semiconductor device 10 according to the present embodiment will be described below.

Figure 6A:
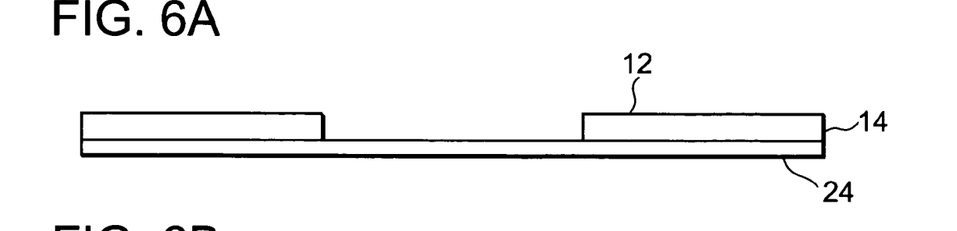
FIG. 6 is a step view showing a manufacturing method of the semiconductor device according to the second embodiment of the present invention.

At first, the mold member 24 shaped in a tape or a metal sheet or the like is pasted and closely sticks to the lower surface of the lead frame 14 (FIG. 6A).

Figure 6B:
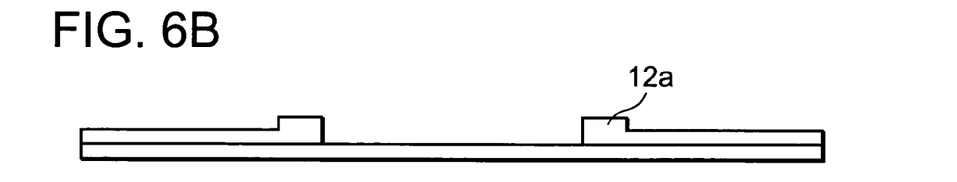

In the next step, the portion other than the front end 12a of the lead 12 is removed by half etching to make the lead 12 other than the front end 12a thinner and to relatively heighten the surface of the front end 12a of the lead 12 (namely, to project the surface of the front end 12a of the lead 12). In other words, the lead 12 other than the front end 12a is made thinner than the front end 12a of the lead 12 to make the front end 12a of the lead 12 relatively thicker (FIG. 6B).

Figure 6C:
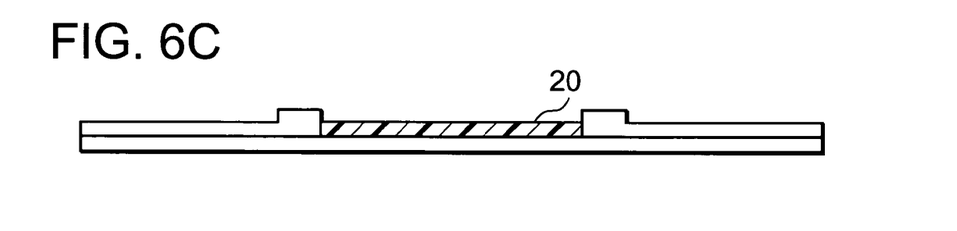

Then, after dripping the liquid cured resin from the upper surface of the lead frame 14 and forming (filling) the liquid cured resin in the region surrounded by the front ends of the leads 12 and between the front ends of the adjacent leads 12, for example, the liquid cured resin is cured by heat and ultraviolet rays to form the resin island 20. At the same time, this resin may fill a gap between the front ends of the adjacent leads 12 (FIG. 6C).

Figure 6D:
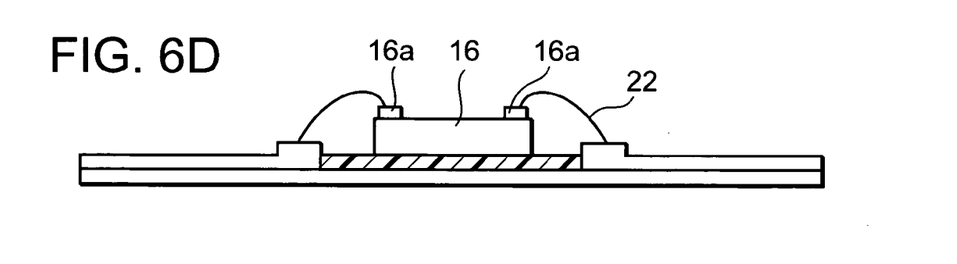

In the next step, the mold member 24 that is pasted to the lower surface of the lead frame 14 is stripped off, the semiconductor chip 16 is secured on the resin island 30, and the bonding pads 16a of the semiconductor chip 16 are electrically connected to the front ends 12a of the leads 12 by the bonding wires 22 (FIG. 6D).

Figure 6E:
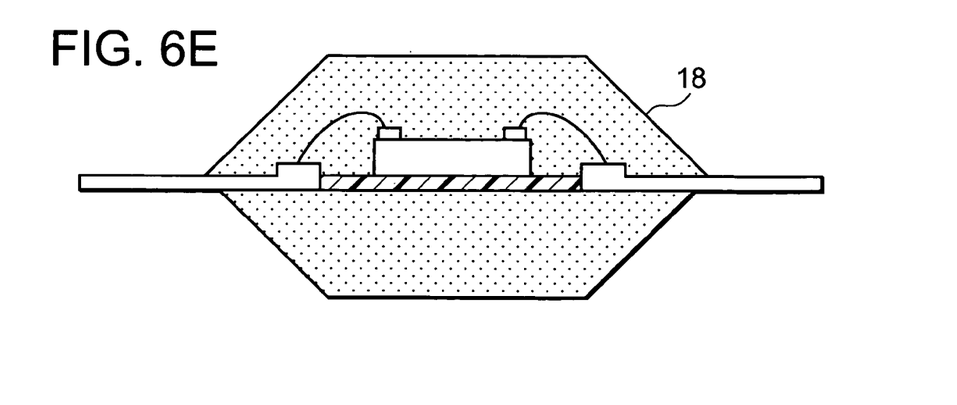

Lastly, the semiconductor chip 16, the bonding wires 22, and the leads 12 are partially sealed by the sealing resin 18 so as to obtain the semiconductor device 10 (FIG. 6E).

Thus, according to the present embodiment, the portion other than the front end of the lead 12 is made thinner by half etching or the like to make the front end 12a of the lead 12 as the connection portion (the bonded surface) relatively thicker than the other portions of the lead 12. This configuration allows the front end 12a to be exposed consistently and makes it possible to obtain a stable connection even if the resin island 20 implanted between the leads 12 is thick.

Particularly, according to the present embodiment, by dripping the liquid cured resin and forming (filling) the liquid cured resin in the region surrounded by the front ends 12a of the leads 12 and between the front ends of the adjacent leads 12, the resin island 20 is formed, so that the liquid cured resin hardly covers the front ends 12a of the leads 12 as the connection portion (bonded surface) upon forming (filling or dripping) the liquid cured resin. This configuration makes it possible to form the resin island 20 with the front ends 12a of the leads 12 always being exposed.

Third Embodiment

Figure 7:
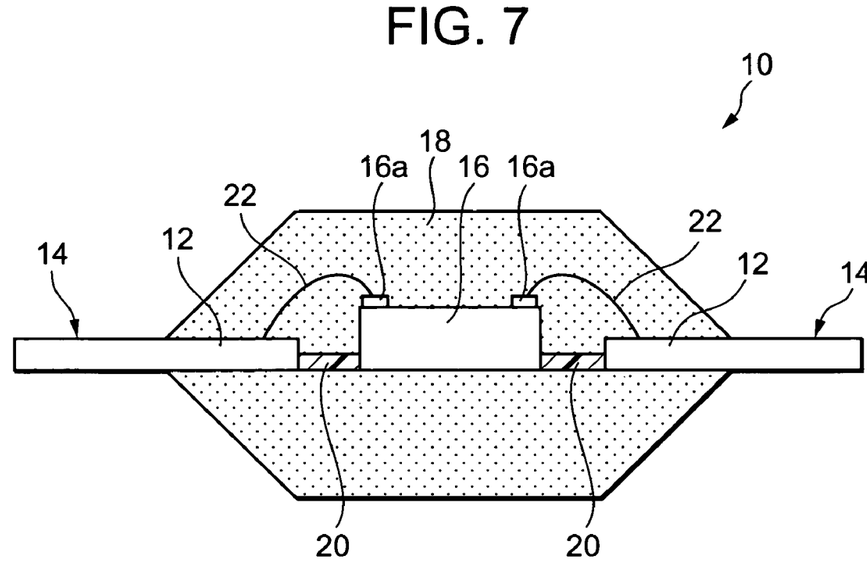
FIG. 7 is a schematic sectional view showing a semiconductor device according to a third embodiment of the present invention.

FIG. 7 is a schematic sectional view showing a semiconductor device according to a third embodiment of the present invention, and FIG. 8 is a step view showing a manufacturing method of the semiconductor device according to the third embodiment of the present invention.

According to the present embodiment, the semiconductor chip 16 (the side surface of the semiconductor chip 16) is partially implanted in the resin island 20 so that the semiconductor chip 16 is supported and fixed by the resin island 20. In other words, the side surface of the semiconductor chip 16 is partially covered with the resin island 20. The explanation except for this point will be herein omitted because the present embodiment is identical to the above-described first embodiment other than this point.

Hereinafter, the manufacturing method of the semiconductor device 10 according to the present embodiment will be described below.

Figure 8A:
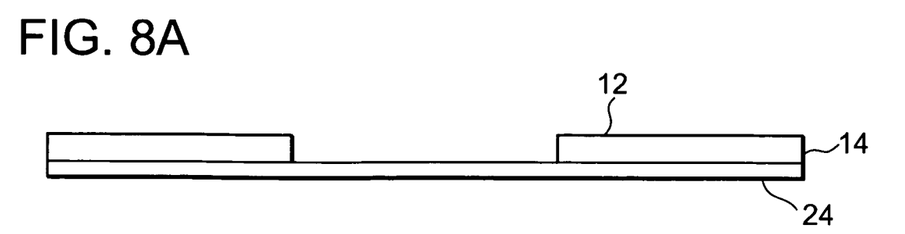
FIG. 8 is a step view showing a manufacturing method of the semiconductor device according to the third embodiment of the present invention.

At first, the mold member 24 shaped in a tape or a metal sheet or the like is pasted and closely sticks to the lower surface of the lead frame 14 (FIG. 8A).

Figure 8B:
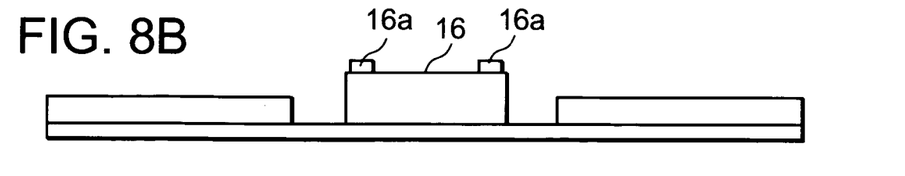

In the next step, between the leads 12 (in the gaps between the opposing front ends of the leads 12), the semiconductor chip 16 is disposed (FIG. 8B).

Figure 8C:
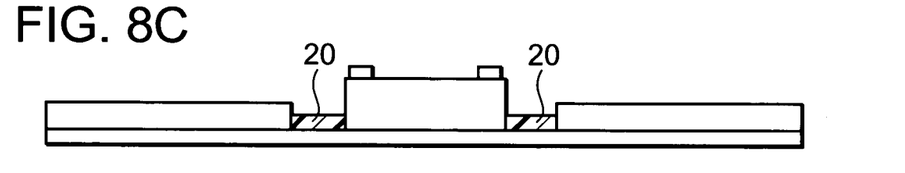

Then, after dripping the liquid cured resin from the upper surface of the lead frame 14 and forming (filling) the liquid cured resin between the front ends of the leads 12 and the semiconductor chip 16 and between the front ends of the leads 12, for example, the liquid cured resin is cured by heat and ultraviolet rays to form the resin island 20. At the same time, this resin may fill a gap between the front ends of the adjacent leads 12 (FIG. 8C). In this case, since the semiconductor chip 16 is disposed between the leads 12, the semiconductor chip 16 is supported and fixed with partially implanted in the resin island 20.

Figure 8D:
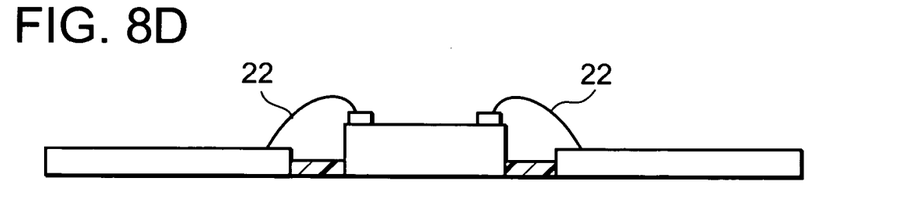

In the next step, the mold member 24 that is pasted to the lower surface of the lead frame 14 is stripped off, and the bonding pads 16a of the semiconductor chip 16 are electrically connected to the leads 12 by the bonding wires 22 (FIG. 8D).

Figure 8E:
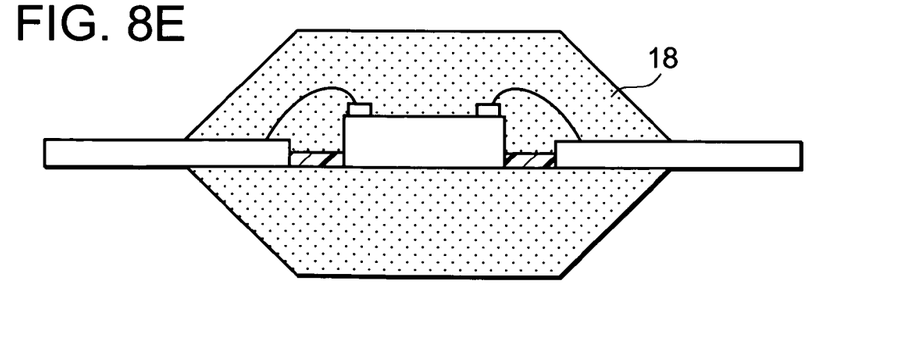

Lastly, the semiconductor chip 16, the bonding wires 22, and the leads 12 are partially sealed by the sealing resin 18 so as to obtain the semiconductor device 10 (FIG. 8E).

Thus, according to the present embodiment, since the semiconductor chip 16 is supported and fixed while being partially implanted in the island resin 20, the semiconductor device can be made thinner by the thickness of the resin island 20.

In addition, according to the present embodiment, after disposing the semiconductor chip 16 between the leads 12 (in the gaps between the opposing front ends of the leads 12), the liquid cured resin is formed (filled) and cured, and the semiconductor chip 16 is supported and fixed while being partially implanted in the island resin 20. This configuration makes it possible to easily make the semiconductor device thinner.

A Fourth Embodiment

FIG. 9 is a step view showing a manufacturing method of a semiconductor device according to a fourth embodiment of the present invention.

According to the present embodiment, upon forming (filling) the liquid cured resin between the leads 12 (in the gaps between the opposing front ends of the leads 12), a pair of sheet type molds 26a and 26b (the mold member) is used. The explanation except for this point will be herein omitted because the present embodiment is identical to the above-described first embodiment other than this point.

Hereinafter, the manufacturing method of the semiconductor device 10 according to the present embodiment will be described below.

Figure 9A:
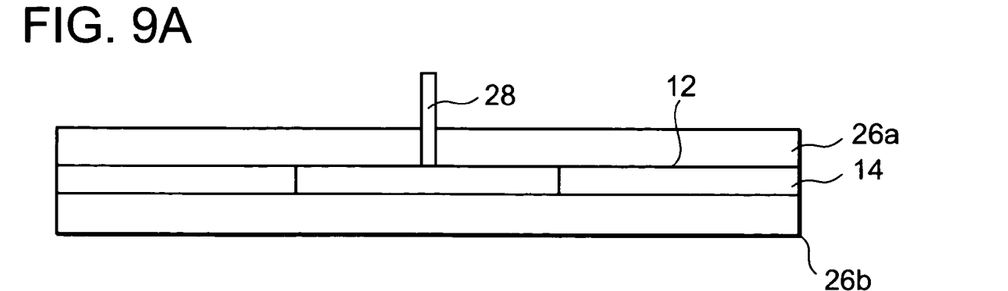
FIG. 9 is a step view showing a manufacturing method of a semiconductor device according to a fourth embodiment of the present invention.

At first, the lead frame 14 is disposed between the sheet type molds 26a and 26b, of which upper and lower surfaces are flat (FIG. 9A).

Figure 9B:
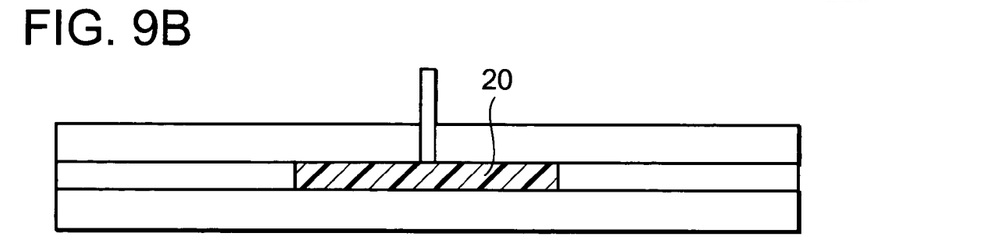

Then, after injecting the liquid cured resin from a resin inject port 28 that has been provided on the sheet type mold 26a in advance and forming (filling) the liquid cured resin in the region surrounded by the front ends of the leads 12 and between the front ends of the adjacent leads 12, for example, the liquid cured resin is cured by heat and ultraviolet rays to form the resin island 20. At the same time, this resin may fill a gap between the front ends of the adjacent leads 12 (FIG. 9B).

In the explanation of the present embodiment, the resin inject port 28 of the liquid cured resin is provided on the sheet type mold 26a, however, this resin inject port may be provided on at least one of the sheet type molds 26a and 26b, and further, a notched portion coming through between the leads 12 may be provided on the lead frame 14 and through this notched portion, the liquid cured resin may be injected.

Figure 9C:
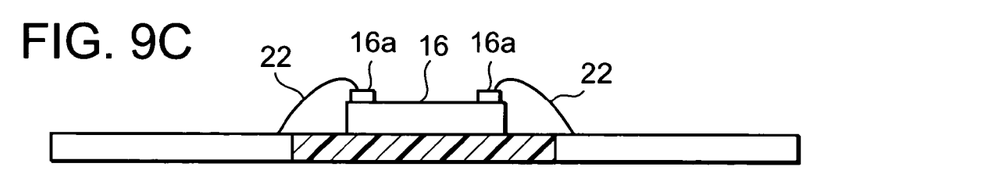

In the next step, after stripping off the sheet type molds 26a and 26b, which are pasted together on the opposite surfaces of the lead frame 14 and cutting the welding flash caused by the resin inject port 28 on the surface of the resin island 20 according to needs, the semiconductor chip 16 is secured on the resin island 20 and the bonding pad 16a of the semiconductor chip 16 is electrically connected to the leads 12 by the bonding wires 22 (FIG. 9C).

Figure 9D:
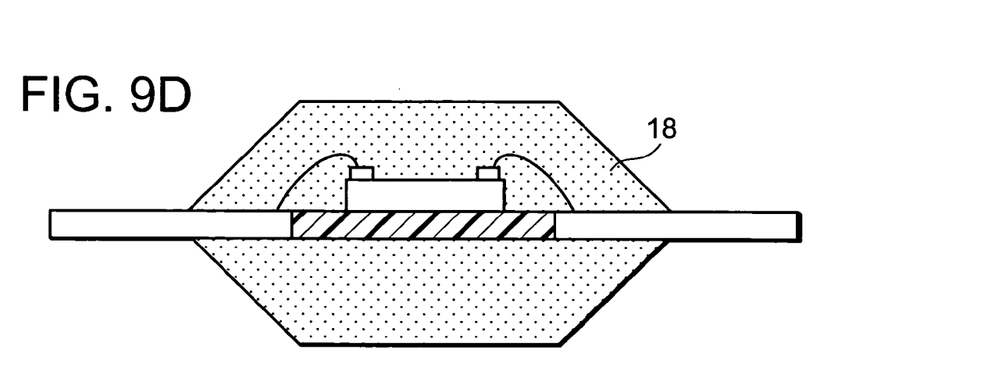

Lastly, the semiconductor chip 16, the bonding wires 22, and the leads 12 are partially sealed by the sealing resin 18 so as to obtain the semiconductor device 10 (FIG. 9D).

Thus, according to the present embodiment, since the lead frame 14 is disposed between the sheet type molds 26a and 26b (the mold members), it is possible to stably form (fill) the liquid cured resin between the leads 12 and the semiconductor device of a stable quality can be obtained.

The present invention should not be interpreted in a limited way in any of the above-described embodiments, and it is a matter of course that the present invention can be realized within a range satisfying the requirements of the present invention.

What is claimed is:

1. A method of manufacturing a semiconductor device comprising:
   preparing a lead frame having a plurality of leads;
   forming a liquid resin between the leads;
   forming a support member between the leads by curing the liquid resin;
   fixing a semiconductor chip on the support member;
   connecting the semiconductor chip to the leads by bonding wires; and
   sealing the semiconductor chip, the bonding wires and portions of the leads by resin.

2. The method according to claim 1, wherein, for each of the leads, a connection portion of the lead, to which the bonding wire is connected, is thicker than the other portions of the lead.

3. The method according to claim 1, wherein said forming the support member comprises:
   attaching a mold member on one surface of the lead frame;
   forming the liquid resin between the leads from a surface of the lead frame opposite to the one surface; and
   curing the liquid resin.

4. The method according to claim 1, wherein said forming the support member comprises:
   disposing the lead frame between a pair of mold members;
   forming the liquid resin between the leads; and
   curing the liquid resin.

5. A method of manufacturing the semiconductor device comprising:
   preparing a lead frame having a plurality of leads;
   arranging a semiconductor chip between the leads;
   forming a liquid resin between the leads and the semiconductor chip;
   forming a support member between the leads and the semiconductor chip for supporting the semiconductor chip by curing the liquid resin;
   connecting the semiconductor chip to the leads by bonding wires; and
   sealing the semiconductor chip, the bonding wires and portions of the leads by resin.

6. The method according to claim 5, wherein said forming the support member comprises:
   attaching a mold member on a first surface of the lead frame;
   forming the liquid resin between the leads and the semiconductor chip from a surface of the lead frame opposite to the first surface; and
   curing the liquid resin.

7. The method according to claim 5, wherein a side surface of the semiconductor chip is in direct contact with the support member.

8. The method according to claim 1, wherein a bottom surface of the semiconductor chip is in direct contact with the support member.

* * * * *